United States Patent
Bisson et al.

(10) Patent No.: US 10,402,531 B2
(45) Date of Patent: Sep. 3, 2019

(54) SPREAD WEAVE INDUCED SKEW MINIMIZATION

(71) Applicant: Ciena Corporation, Hanover, MD (US)

(72) Inventors: Robert Bisson, Kanata (CA); Marko Antonic, Kanata (CA)

(73) Assignee: Ciena Corporation, Hanover, MD (US)

( * ) Notice: Subject to any disclaimer, the term of this patent is extended or adjusted under 35 U.S.C. 154(b) by 239 days.

(21) Appl. No.: 15/161,074

(22) Filed: May 20, 2016

(65) Prior Publication Data

US 2017/0339780 A1   Nov. 23, 2017

(51) Int. Cl.
  *G06F 17/50*  (2006.01)
  *H05K 3/00*   (2006.01)
  *H05K 1/02*   (2006.01)
  *H05K 1/03*   (2006.01)
  *H05K 1/18*   (2006.01)

(52) U.S. Cl.
  CPC ....... *G06F 17/5077* (2013.01); *H05K 1/0245* (2013.01); *H05K 3/0005* (2013.01); *H05K 1/024* (2013.01); *H05K 1/0248* (2013.01); *H05K 1/0298* (2013.01); *H05K 1/0366* (2013.01); *H05K 1/182* (2013.01); *H05K 2201/029* (2013.01); *H05K 2201/044* (2013.01)

(58) Field of Classification Search
  CPC ........... H05K 2201/044; H05K 1/0298; H05K 1/0245; H05K 1/0243; H05K 1/0248; H05K 2201/10287; G06F 1/183; G06F 1/185; G06F 1/189; G06F 13/40; G06F 1/184
  USPC .................................. 716/118–119, 126, 138
  See application file for complete search history.

(56) References Cited

U.S. PATENT DOCUMENTS

| | | | |
|---|---|---|---|
| 7,117,464 B2* | 10/2006 | Frank ................. | G06F 17/5081 716/112 |
| 2004/0181764 A1* | 9/2004 | Brist .................. | G06F 17/5077 174/258 |
| 2015/0131256 A1* | 5/2015 | Kashiwakura .......... | G06F 1/183 361/785 |
| 2017/0325334 A1* | 11/2017 | Guo ........................ | H05K 3/10 |

* cited by examiner

*Primary Examiner* — Nghia M Doan
(74) *Attorney, Agent, or Firm* — Clements Bernard Walker PLLC; Christopher L. Bernard; Lawrence A. Baratta, Jr.

(57) ABSTRACT

A method of manufacturing a printed circuit board (PCB) includes determining a weft direction of the PCB, and defining a routing design of differential pairs. The routing design is designed to have a fixed region in the weft direction. The method further includes manufacturing the PCB according to the routing design.

14 Claims, 10 Drawing Sheets

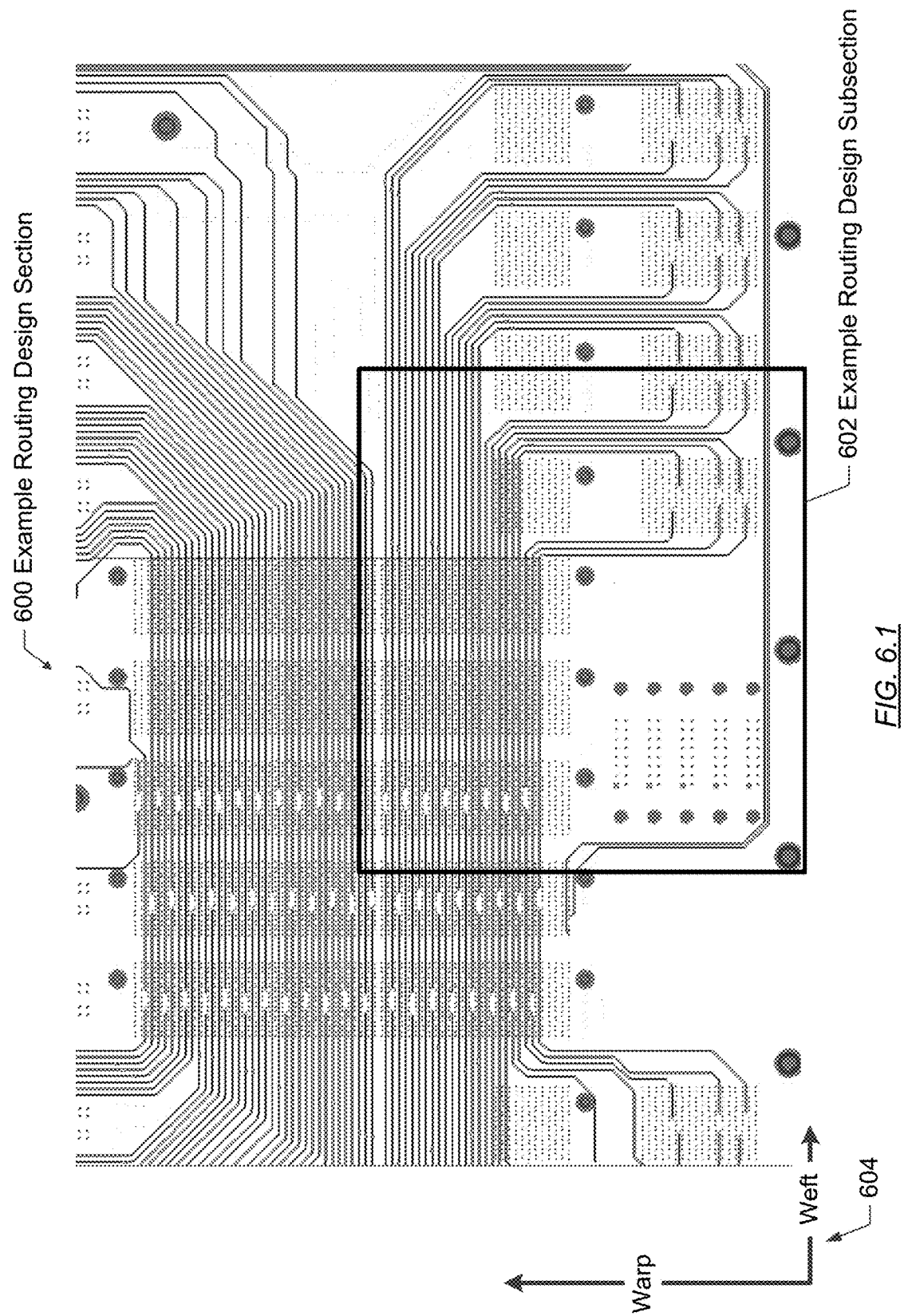
FIG. 6.1

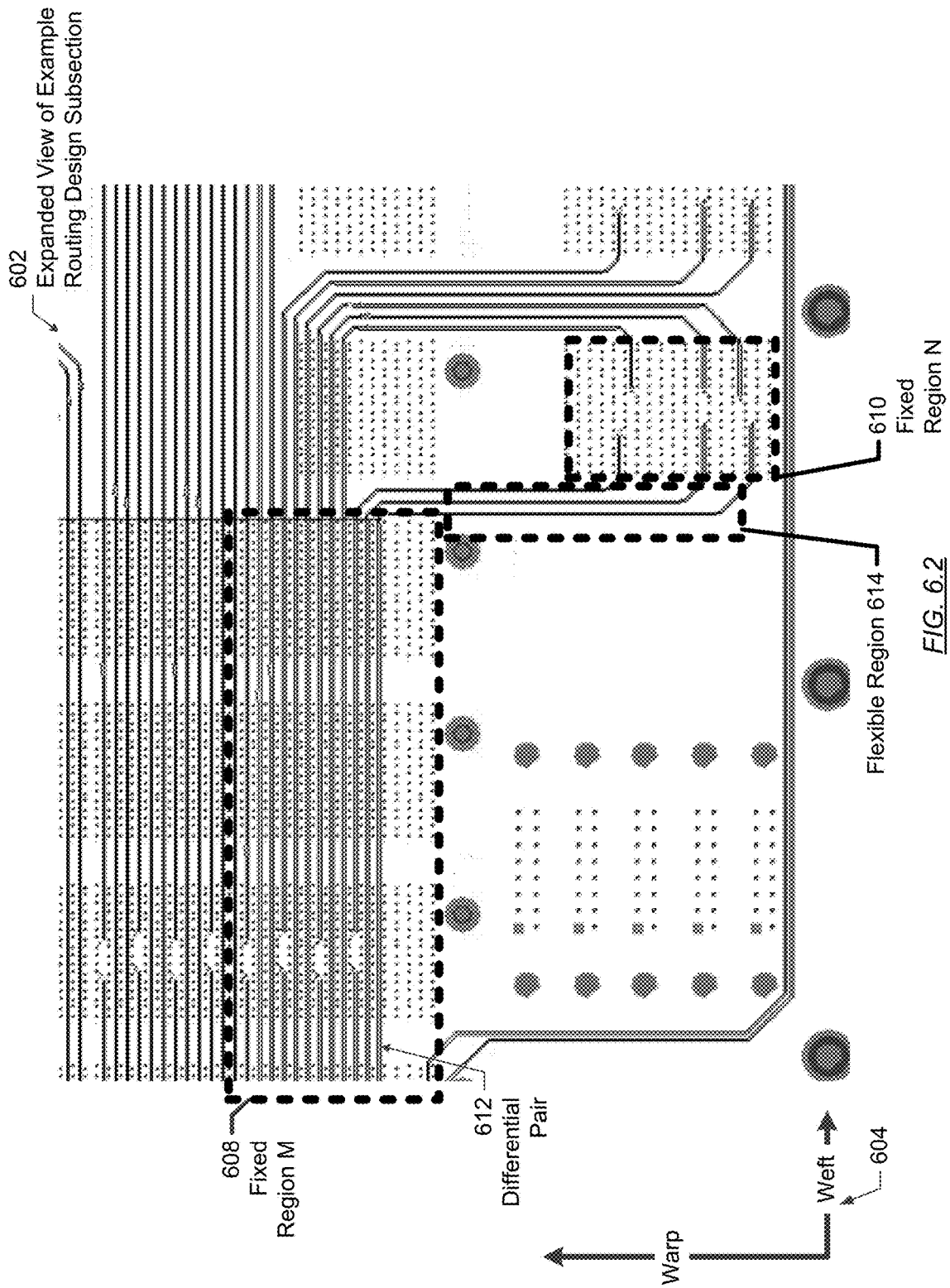
FIG. 6.2

SPREAD WEAVE INDUCED SKEW MINIMIZATION

BACKGROUND

A printed circuit board (PCB) mechanically supports and electrically connects electronic components using conductive traces, connectors and other features. PCBs provide mechanical strength through glass weave and resin systems. The style of these weaves varies, depending on PCB dimension and signal integrity requirements. Often, spread glass weaves are used to enhance signal integrity performance of PCBs. Further, components, such as capacitors, resistors, and active devices, may be added to the PCB. PCBs are used for a variety of electronic apparatuses. For example, one such set of electronic apparatuses are backplanes. Backplanes typically provide interconnect between separate PCBs or modules through use of mating connectors. Backplane designs may have a number of high speed signals pairs restricted to either horizontal or vertical routing due to narrow high speed connector breakout channels. Many high speed connectors have narrow pin field routing channels that are designed to provide a low inter pair crosstalk path out of the connector area. These narrow routing channels can be called fixed regions, and force signals to be routed in a uniform direction without bends or angles, referred to as 0 degree or restricted routing. Connectors may be situated beside each other extending the area where 0 degree routing is required.

SUMMARY

In general, in one aspect, one or more embodiments relate to a method of manufacturing a printed circuit board (PCB). The method includes determining a weft direction of the PCB, and defining a routing design of differential pairs. The routing design is designed to have a fixed region in the weft direction. The method further includes manufacturing the PCB according to the routing design.

In general, in one aspect, one or more embodiments relate to a printed circuit board (PCB) that includes a spread weave of woven glass fibers having a warp direction and a weft direction, PCB features defining a fixed region of the PCB, and differential pairs of routed traces. The differential pairs are in the weft direction when in the fixed region.

In general, in one aspect, one or more embodiments relate to a method of designing a printed circuit board (PCB). The method includes determining a weft direction of the PCB, defining, with a computer processor, a routing design of differential pairs. The routing design is designed to have a fixed region in the weft direction. The method further includes transmitting, with the computer processor, the routing design to a manufacturer.

Other aspects of the invention will be apparent from the following description and the appended claims.

BRIEF DESCRIPTION OF DRAWINGS

FIGS. 5, 6.1, and 6.2 show an example in accordance with one or more embodiments of the invention.

DETAILED DESCRIPTION

Figure 1:
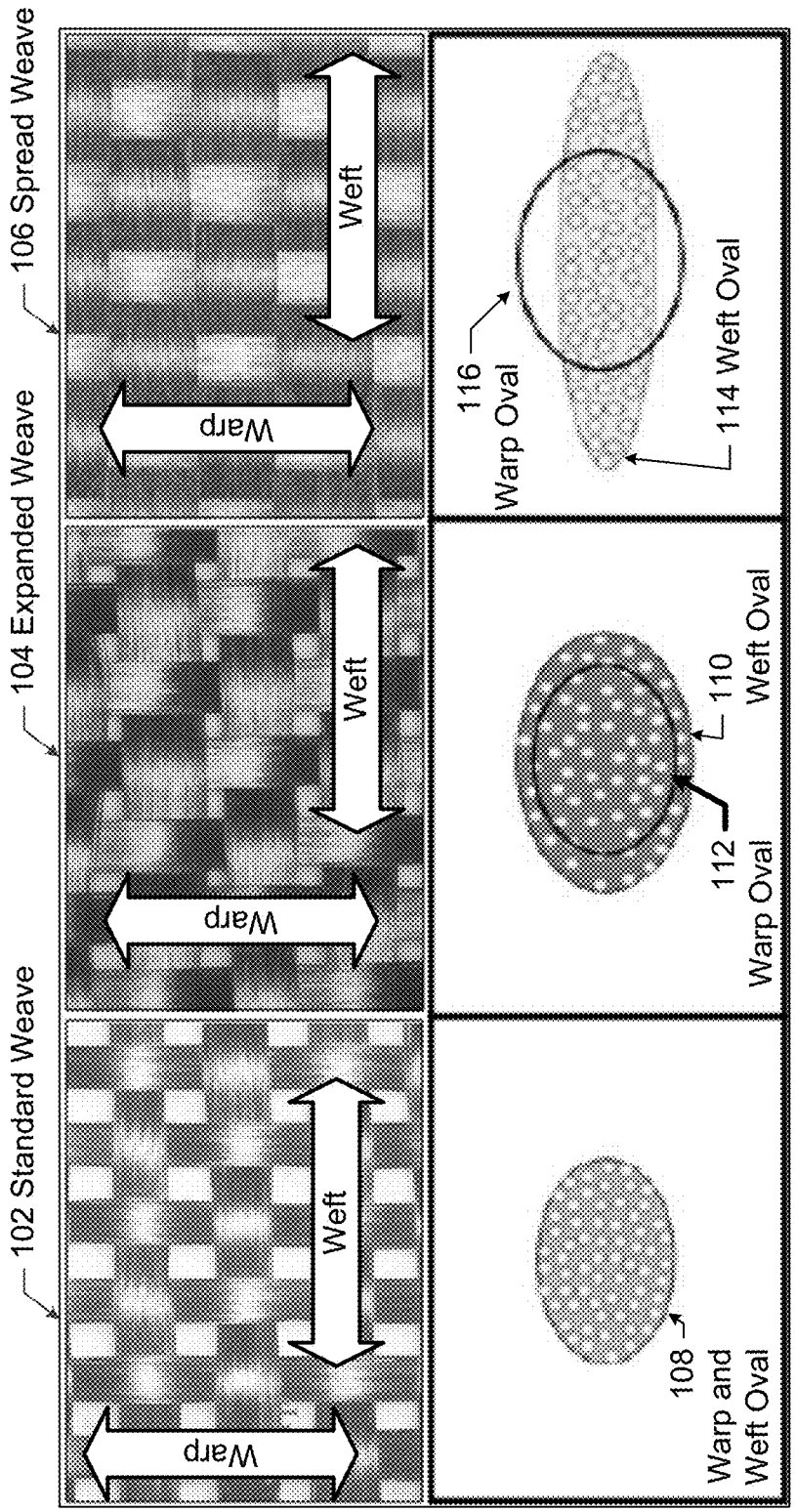
FIGS. 1 and 2 show diagrams of example weaves in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention are directed to manufacturing a printed circuit board (PCB) having differential pairs of traces. The PCB is made of a woven fiber that has a spread weave. The spread weave has a warp and weft direction. The routing design of the differential traces has the fixed region in the weft direction. By setting the fixed region to be in the weft direction, the skew caused by a difference in dielectric permittivity between the traces in the differential pair is minimized.

Figure 2:
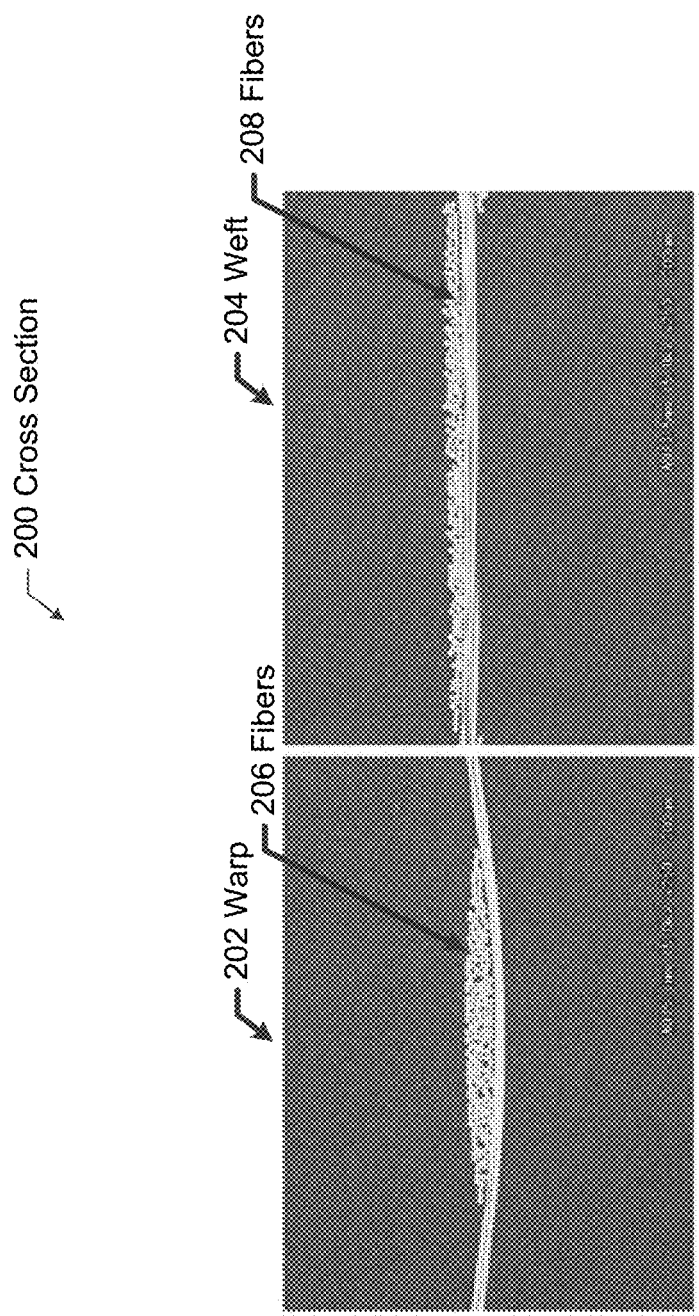

Turning to the FIGs, FIGS. 1 and 2 show diagrams of example weaves in accordance with one or more embodiments of the invention. In particular, FIG. 1 shows example diagrams of example weaves in accordance with one or more embodiments of the invention. As shown in the example in FIG. 1, a standard weave (102) has fibers that are at least approximately the same width in both the warp and the weft direction. Further, as shown, spacing may exist within the weave. In an expanded weave (104), the fibers are spread in the weft direction more than in the warp direction. Similar to the standard weave, spacing may exist within the weave. In the spread weave (106), the fibers are spread in the weft direction more than the warp direction to remove spacing between fibers.

Continuing with FIG. 1, below each box showing the type of weave, a box with ovals representing the thickness of the fibers in each direction is shown. In particular, as shown in FIG. 1, the standard weave (102) has fibers of at least approximately equal thickness in both the warp and the weft direction as shown by having the same size ovals (108). In the expanded weave (104), the fibers are stretched both vertically and horizontally more for the weft direction (e.g., weft oval (110)) than the warp direction (e.g., warp oval (112)). In the spread weave (106), the fibers are stretch horizontally more for the weft direction (114) and vertically more for the warp direction (116). In other words, because of the amount of stretching of the fibers in the weft direction (114), the center thickness of the fibers in the weft direction is less than the warp direction (116). In one or more embodiments, the fibers may have the same stretch in the warp direction regardless of the type of weave.

FIG. 2 shows cross sections of a spread weave of glass fibers for a PCB in the warp cross section (202) and the weft cross section (204). In other words, warp cross section (202) is a cross section of the warp direction. As shown by comparing the glass fibers (e.g., fibers (206), fibers (208)) for the warp cross section (202) and the weft cross section (204), the fibers in the warp direction are concentrated about the center with less toward the outside. In contrast, the fibers (208) are more evenly distributed across the fabric in the weft direction. Because of the fiber distribution differences between the directions, the dielectric permittivity and therefore propagation time and impedance on the traces are more uneven in the warp direction as compared to the weft direction. One or more embodiments are directed to aligning the routing design on the weft direction of the fabric of the PCB to minimize the differences in dielectric permittivity seen by each trace within the differential pairs.

In particular, one or more embodiments are directed to routing differential pairs of traces on a PCB manufactured using a spread weave. Differential pairs of traces are used for differential signaling, which is a method for electrically transmitting information using two complementary signals. A transmitter may transmit a single input signal into a pair of outputs, on the traces, that are 180 degrees out of phase. A receiver recovers the signal as the differences in voltage on the two traces. One important aspect of the differential signal is that each trace has approximately the same propagation time and impedance. The difference in propagation time and impedance between the two traces in the differential pair may be referred to as skew. One or more embodiments are directed to minimizing the skew.

A trace may be conducting material configured for carrying an electrical signal across the PCB. Ground planes on either side of the differential pair may include conducting material configured as a return path for an electrical signal transmitted through the traces. Gaps may be located between the traces in the differential pair and the ground plane. The gaps may be PCB material between corresponding ground planes and the traces.

Figure 3:
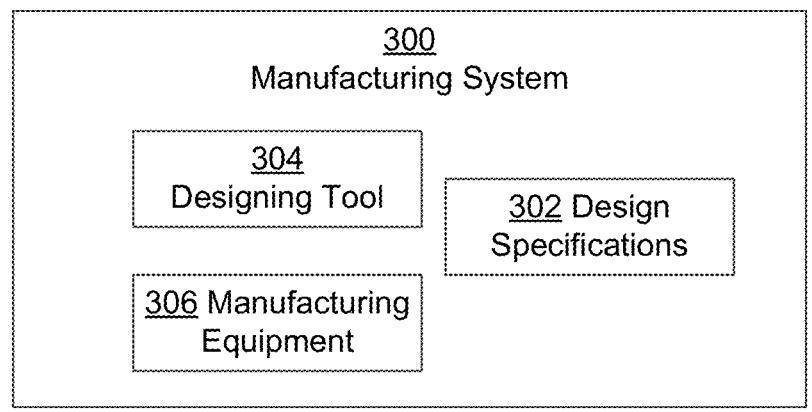
FIGS. 3 and 4 shows diagrams of systems in accordance with one or more embodiments of the invention.
Figure 4:
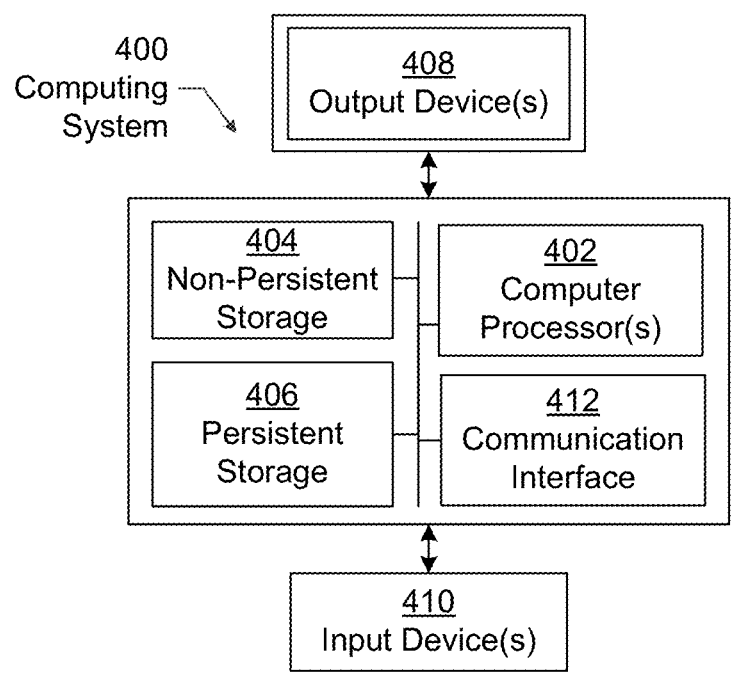

FIGS. 3 and 4 shows diagrams of systems in accordance with one or more embodiments of the invention. As shown in FIG. 3, a manufacturing system (300) includes a design specification (302), designing tool (304), and manufacturing equipment (306). The design specification (302) may include a PCB specification that defines, amongst other aspects, the warp and weft direction of the PCB. The design specification may further define the composition of materials, the number of layers, and the position of connector pins for the PCB. The design specification (302) may further include a routing design. The routing design specifies the layout of the traces on the PCB. For example, the routing design may define the position of the traces with respect to each other, the pins, and other components of the PCB. In one or more embodiments of the invention, the routing design specifies the traces in the fixed region of the PCB as being in the weft direction. In the flexible region, the routing design may define other positions of traces to reduce skew. For example, the routing design may specify that a differential pair is routed at a non-zero-degree angle to the warp direction and the weft direction while in the flexible region. In other words, the differential pair is not routed to be at the warp direction or the weft direction while in the flexible region. By way of another example, the routing design may define that a differential pair is routed using offsetting while in the flexible region. By way of another example, the routing design may define that a differential pair is routed using arcing while in the flexible region.

The design specification may further define the position of integrated circuit components, such as capacitors, transistors, and resistors on the PCB. In one or more embodiments of the invention, the design specification may be stored, temporarily or permanently, in whole or in part, in a data repository (not shown). The data repository is any type of storage unit and/or device (e.g., a file system, database, collection of tables, or any other storage mechanism) for storing data. Further, the data repository may include multiple different storage units and/or devices. The multiple different storage units and/or devices may or may not be of the same type or located at the same physical site.

Continuing with FIG. 3, the designing tool (304) is a tool that is configured to generate the design specification (302). In one or more embodiments of the invention, the designing tool (304) is hardware, software, firmware, or a combination thereof. For example, the designing tool (304) may be or may execute on a computing system discussed below with reference to FIG. 4. The designing tool (304) may include functionality to generate a routing layout automatically (e.g., based on rules and requirements), and/or with a user, such as using a user interface.

Manufacturing equipment (306) corresponds to physical equipment that manufactures PCBs. In particular, the manufacturing equipment includes functionality to build one or more PCBs with routed traces and integrated circuits.

Embodiments of the invention may be implemented on a computing system. Any combination of mobile, desktop, server, router, switch, embedded device, or other types of hardware may be used. For example, as shown in FIG. 4.1, the computing system (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), and numerous other elements and functionalities.

The computer processor(s) (402) may be an integrated circuit for processing instructions. For example, the computer processor(s) may be one or more cores or micro-cores of a processor. The computing system (400) may also include one or more input devices (410), such as a touchscreen, keyboard, mouse, microphone, touchpad, electronic pen, or any other type of input device.

The communication interface (412) may include an integrated circuit for connecting the computing system (400) to a network (not shown) (e.g., a local area network (LAN), a wide area network (WAN) such as the Internet, mobile network, or any other type of network) and/or to another device, such as another computing device.

Further, the computing system (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the invention.

The computing system (400) in FIG. 4.1 may be connected to or be a part of a network. For example, the network may include multiple nodes. Each node may correspond to a computing system, such as the computing system shown in FIG. 4.1, or a group of nodes combined may correspond to the computing system shown in FIG. 4.1. By way of an example, embodiments of the invention may be implemented on a node of a distributed system that is connected to other nodes. By way of another example, embodiments of the invention may be implemented on a distributed computing system having multiple nodes, where each portion of the invention may be located on a different node within the distributed computing system. Further, one or more elements of the aforementioned computing system (400) may be located at a remote location and connected to the other elements over a network.

While FIGS. 3 and 4 show a configuration of components, other configurations may be used without departing from the scope of the invention. For example, various components may be combined to create a single component. As another example, the functionality performed by a single component may be performed by two or more components.

Figure 5:
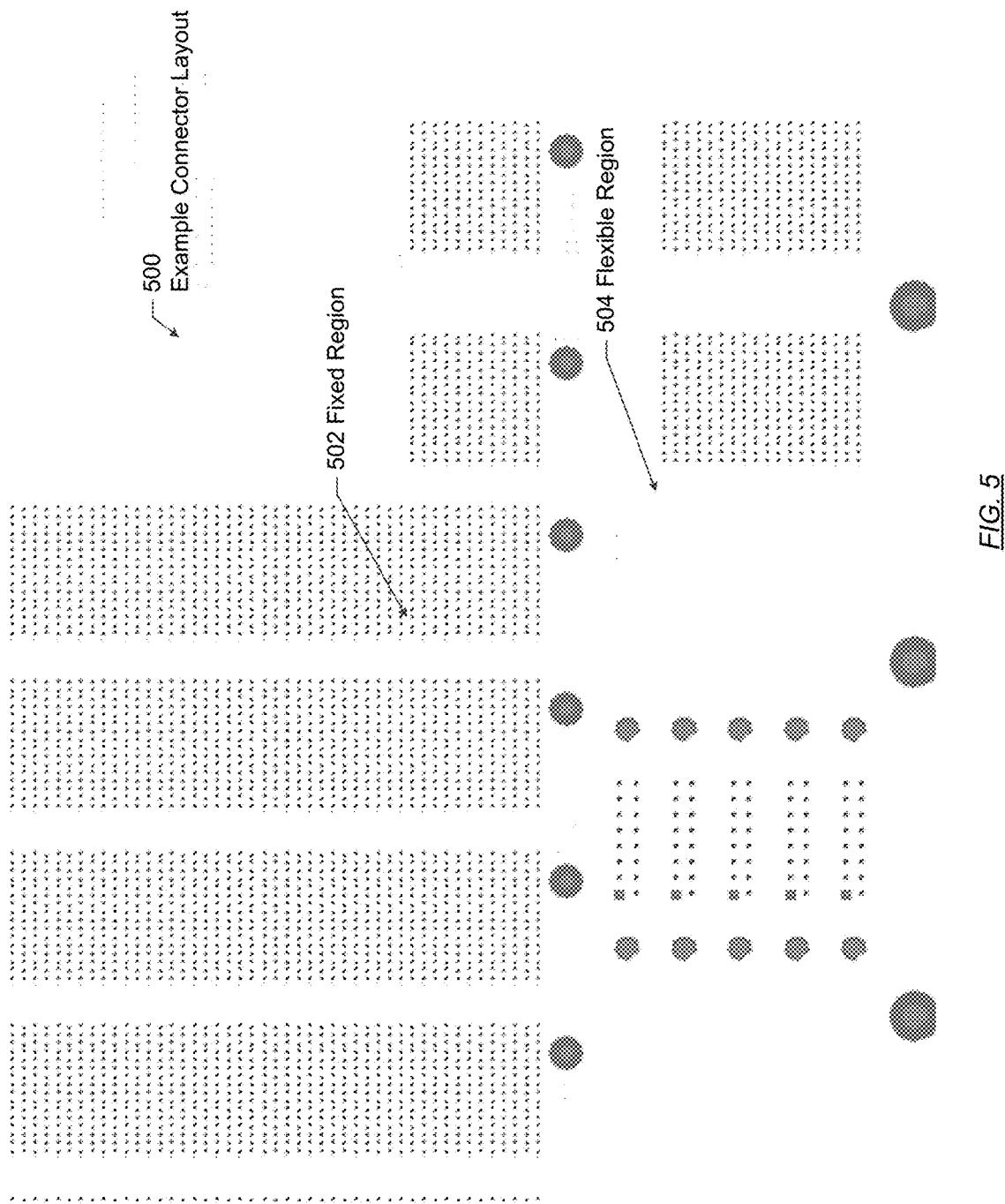

FIGS. 5, 6.1, and 6.2 show an example in accordance with one or more embodiments of the invention. Turning to FIG. 5, FIG. 5 shows an example connector layout on a PCB. In particular, each dot in FIG. 5 is a connector pin. The connector pins define a fixed region and a flexible region on the PCB in accordance with one or more embodiments of the invention. More particularly, in the fixed region (502), because of the close spacing between connector pins, differential pairs are forced to be routed at 0 degrees or 90 degrees (e.g., in the warp or weft direction). In other words, sufficient space does not exist in the fixed region (502) for the differential pair to be routed at any other angle. The fixed region (502) may be referred to as a 0/90-degree region. In contrast, in the flexible region (504), the differential pairs may be routed at virtually any angle. In other words, the sparsity of connector pins allows the differential pair of traces to be routed at virtually any angle.

Although FIG. 5 shows one example of a fixed region, in general, the fixed region may be any region in which the traces are restricted to linear non-angled routing. Thus, one or more embodiments is not limited to a backplane. For example, the fixed region can be caused by various PCB features besides connector pins, such as fields of vias, other through hole components, ball grid array (BGA) breakouts, etc.

FIG. 6.1 show an example section of a routing design (600) in accordance with one or more embodiments of the invention. As shown by axis definition (604), the warp direction is in the vertical direction and the weft direction is in the horizontal direction. FIG. 6.1 shows an example routing design subsection (602) that is shown as an expanded view in FIG. 6.2.

In particular, FIG. 6.2 shows an expanded view of the example routing design subsection in accordance with one or more embodiments of the invention. The example is shown on the connector pin layout shown in FIG. 5. In FIG. 6.2, each set of lines that are both between the same connector pins is a differential pair. As shown by the axis definition (604), for the fixed regions (e.g., fixed region M (608), fixed region N (610)), the differential pairs (e.g., differential pair (612)) are routed to be in the weft direction. In the flexible region (614), other routing techniques may be used (not shown) to reduces effects of skew.

Figure 7:
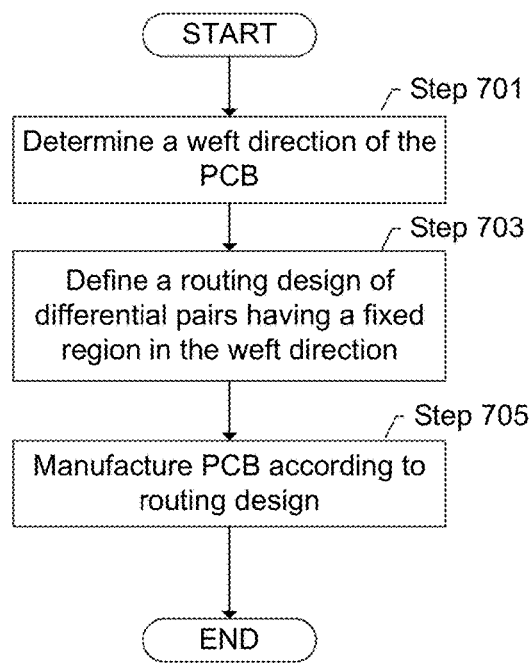
FIGS. 7 and 8 show flowcharts in accordance with one or more embodiments of the invention.
Figure 8:
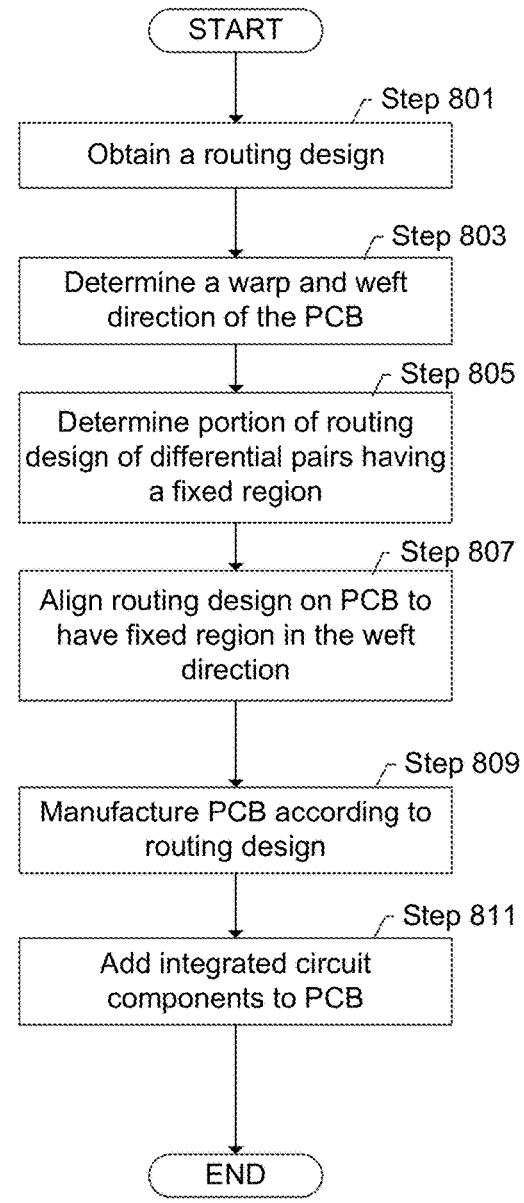

FIGS. 7 and 8 show flowcharts in accordance with one or more embodiments of the invention. While the various steps in these flowcharts are presented and described sequentially, one of ordinary skill will appreciate that some or all of the steps may be executed in different orders, may be combined or omitted, and some or all of the steps may be executed in parallel. Furthermore, the steps may be performed actively or passively. For example, some steps may be performed using polling or be interrupt driven in accordance with one or more embodiments of the invention.

FIG. 7 shows a flowchart for manufacturing a PCB in accordance with one or more embodiments of the invention. In Step 701, the weft direction of the PCB is determined in accordance with one or more embodiments of the invention. In one or more embodiments of the invention, the weft direction is defined by the configuration of the manufacturing equipment. A manufacturer may specify which direction is the weft direction and which direction is the warp direction.

In Step 703, a routing design of differential pairs having a fixed region in the weft direction is defined in accordance with one or more embodiments of the invention. In one or more embodiments of the invention, if the PCB is not yet configured with connector pins, then the connector pins are designed with the routing design so that the result is that the differential pairs, while in the fixed region, are in the weft direction. If the arrangement of connector pins is pre-defined with respect to the warp and weft direction, then the routing is defined such that the routing of differential pairs is in the weft direction. For the flexible region, other techniques may be used to prevent the differential pairs from being arranged in the warp direction. One or more embodiments may perform the routing design automatically or with human interaction using a computing device.

In Step 705, the PCB is manufactured according to the routing design in accordance with one or more embodiments of the invention. For example, the routing design, including differential routing, of each layer may be etched into copper on top of woven glass fibers impregnated with resin with each layer subsequently stacked and vias and pins drilled and plated to create the PCB. Manufacturing equipment may be employed to implement the routing design in a PCB.

FIG. 8 shows a flowchart in accordance with one or more embodiments of the invention. In Step 801, a routing design is obtained in accordance with one or more embodiments of the invention. In some embodiments, the routing design may be pre-defined prior to the identification of the warp and weft direction of the PCB. In such a scenario, obtaining the routing design may be performed in a manner similar to Step 703, and without consideration of the warp and weft direction.

In Step 803, a warp and weft direction of the PCB is determined in accordance with one or more embodiments of the invention. Step 803 may be performed in a same or similar manner to Step 701 discussed above.

In Step 805, portions of the routing design of differential pairs having a fixed region is determined in accordance with one or more embodiments of the invention. In one or more embodiments of the invention, the layout of the connector pins on the PCB are determined. The layout may be performed with or without consideration of the current routing design.

In Step 807, the routing design is aligned on the PCB to have a fixed region in the weft direction in accordance with one or more embodiments of the invention. In other words, the PCB is aligned the routing design such that the fixed region is in the weft direction.

In Step 809, the PCB is manufactured according to the routing design in accordance with one or more embodiments of the invention. Step 809 may be performed in a same or similar manner to Step 705 of FIG. 7.

In Step 811, integrated circuit components may be added to the PCB in accordance with one or more embodiments of the invention. For example, transistors, resistors, capacitors and other components may be attached to the PCB to transform the PCB into an integrated circuit.

Figure 9:
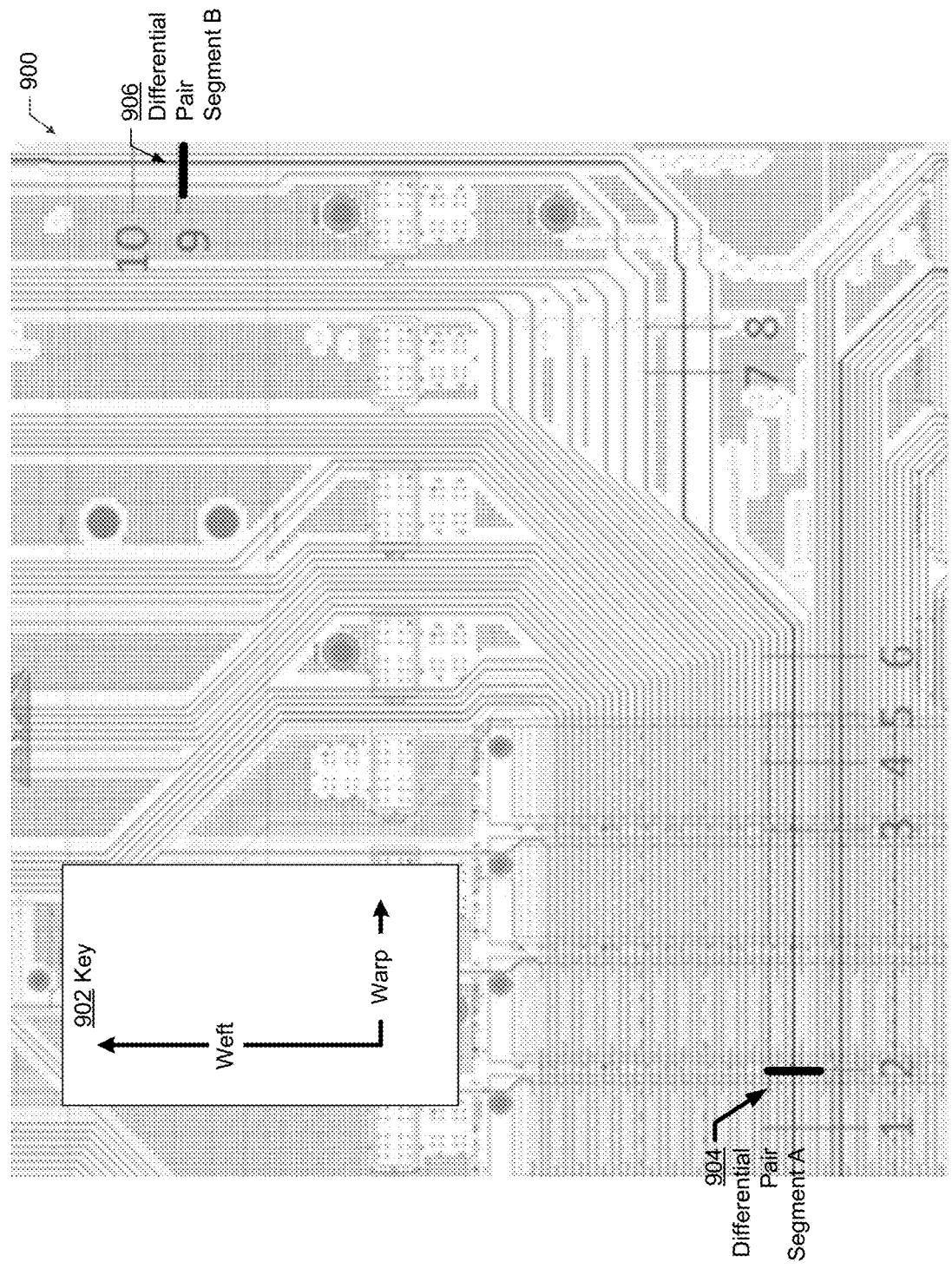
FIGS. 9, 10.1, 10.2, and 11 show an example in accordance with one or more embodiments of the invention.
Figure 10:
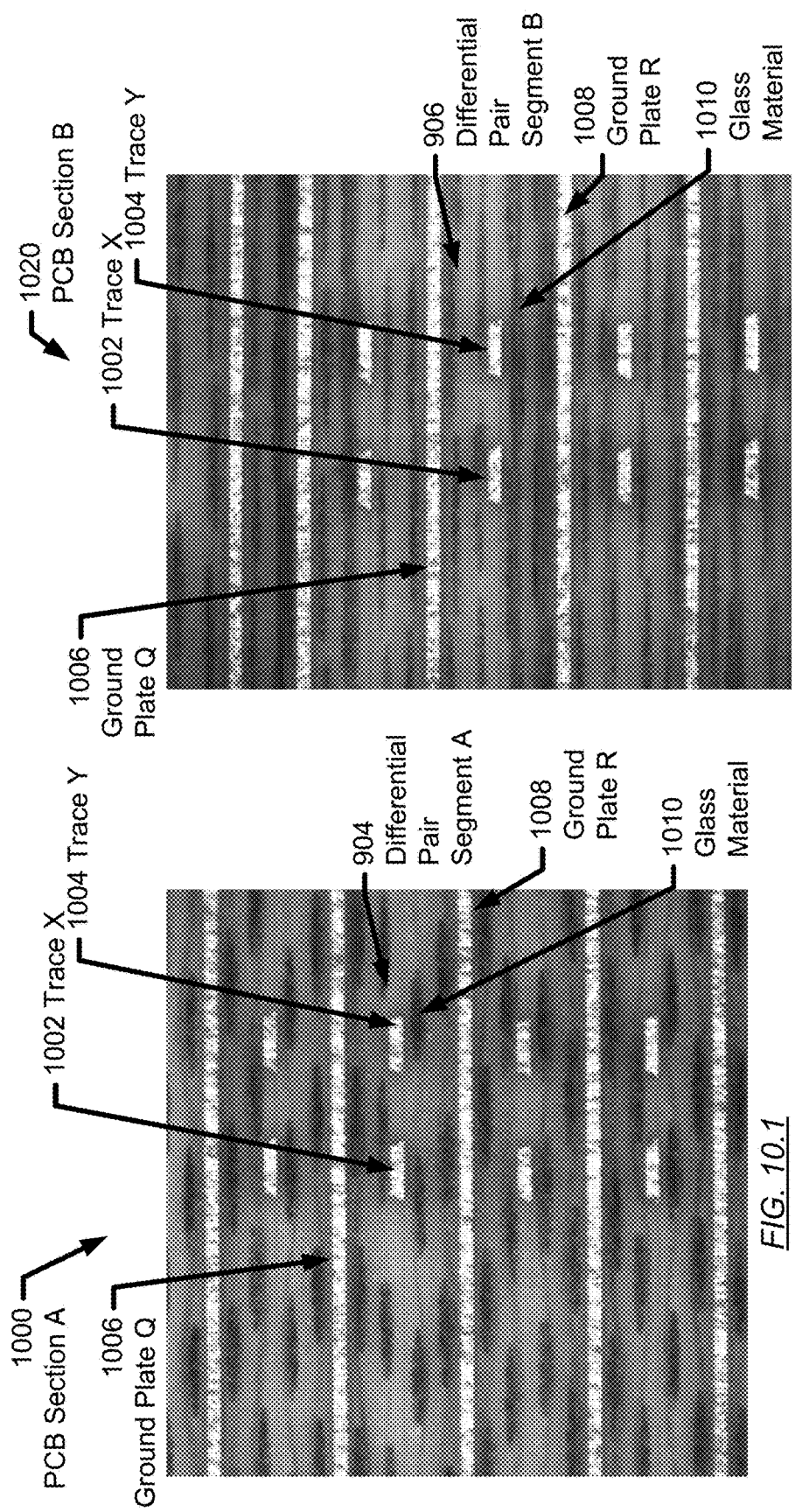

FIGS. 9, 10.1, 10.2, and 11 show an example in accordance with one or more embodiments of the invention. In particular, FIGS. 9, 10.1, 10.2, and 11 provides an example of the differences between routing in the warp direction and routing in the weft direction. The example in FIGS. 9, 10.1, 10.2, and 11 is for explanatory purposes only and not intended to limit the scope of the invention.

Turning to FIG. 9, FIG. 9 shows a routing design (900) on a PCB. As shown by key (902), the warp direction is horizontal and the weft direction is vertical. For the purposes of the example, consider differential pair segment A (904) and differential pair segment B (906). Differential pair segment A (904) is routed in the warp direction. The routing in the warp direction is for explanatory purposes only. Differential pair segment B (906) is routed in the weft direction.

FIGS. 10.1 and 10.2 show cross sections of a multilayer PCB having the differential pair segments shown in FIG. 9. In particular, FIG. 10.1 shows PCB section A (1000), which is a cross section of the PCB at position of the differential pair segment A (904) in FIG. 9. As shown in FIG. 10.1, the differential pair segment A (904) is formed by two traces (e.g., trace X (1002), trace Y (1004)), which have an adjacent ground plate (e.g., ground plate Q (1006), ground plate R (1008)) on either side of the traces (e.g., trace X (1002), trace Y (1004)). FIG. 10.1 shows the glass material (1010) as dark oval shapes. As shown in FIG. 10.1, the glass material is thick and not evenly distributed because of being a cross section of the warp direction. Because of the difference in dielectric permittivity between the glass and the resin filler, the lopsided distribution of the glass material creates a propagation time and impedance difference between the traces of the differential pair. In other words, trace X (1002) has more glass material than trace Y (1004) between the trace and the ground plates. The differences result in a skew between trace X (1002) and trace Y (1004).

In comparison, FIG. 10.2 shows PCB section B (1020), which is a cross section of the PCB at position of the differential pair segment B (906) in FIG. 9. The differential pair segment B (906) has the two traces (e.g., trace X (1002), trace Y (1004)), which have the adjacent ground plate (e.g., ground plate Q (1006), ground plate R (1008)) on either side of the traces (e.g., trace X (1002), trace Y (1004)). Like FIG. 10.1, FIG. 10.2 shows the glass material (1010) as dark oval shapes. As shown in FIG. 10.2, the glass material is much thinner and evenly distributed than FIG. 10.1 because of being a cross section of the weft direction. With the even distribution, the amount of glass between the respective trace and the ground plates are approximately equal, resulting in minimal skew.

Figure 11:
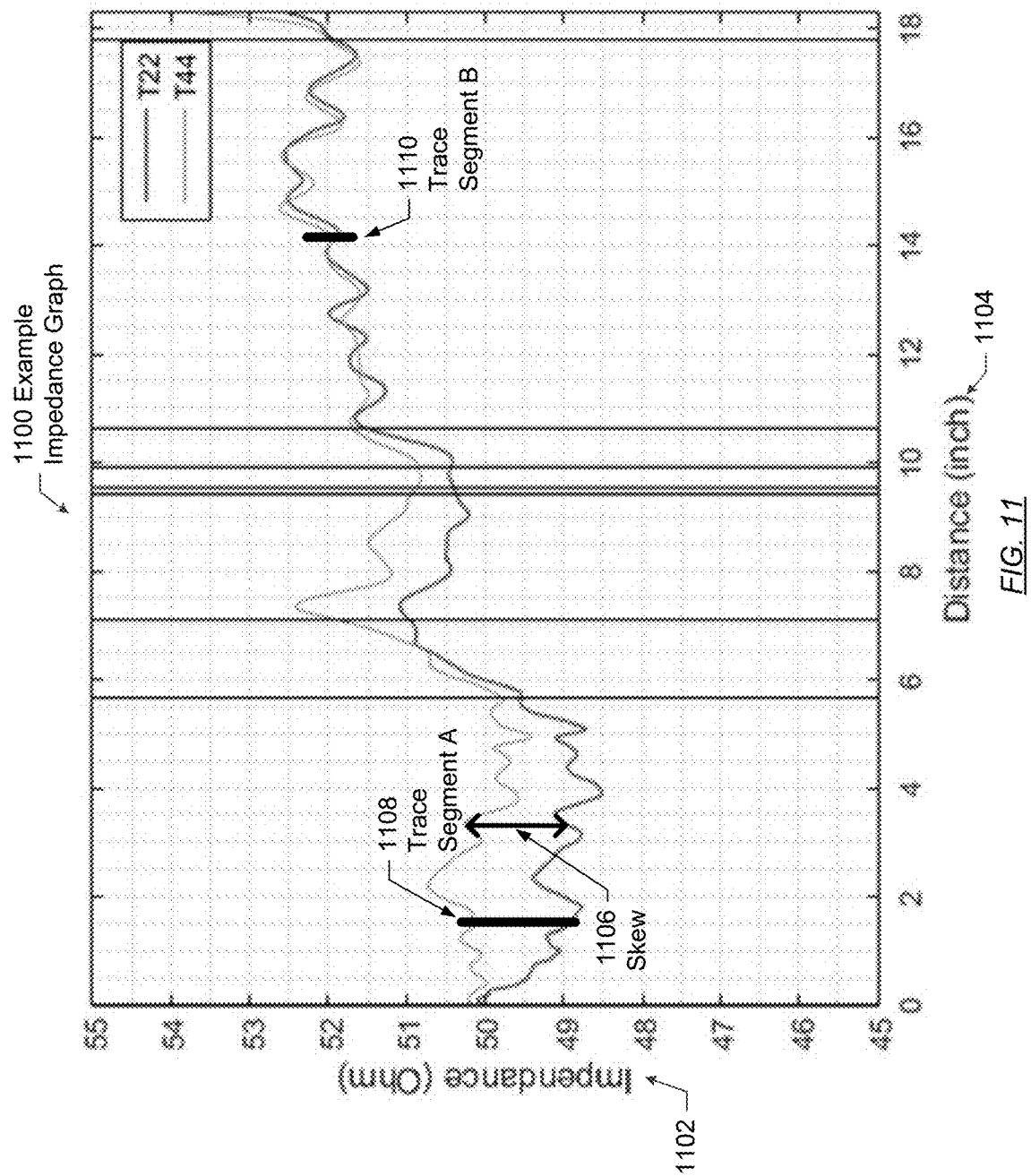

FIG. 11 shows an example impedance graph (1100) of the differential traces. The impedance is on the vertical axis (1102) and the distance along the differential traces is shown on the horizontal axis (1104). The skew (e.g., skew 1106) is indicated by the difference in impedance at a particular distance. In other words, the presence of the skew may be observed by comparing the absolute value of the vertical distance between the traces for a particular value of distance. In this example, the difference in impedance directly indicates the presence of skew because the impedance variation comes from the non-uniform distribution of the glass fibers seen in FIG. 10.1, and not another cause such as trace dimensions. In actuality, the difference in impedance may be based on other factors, but in this example FIG. 10.1 indicates the effect is caused by glass fiber weave effects. As shown by the vertical bar for trace segment A (1108) as compared to the vertical bar for trace segment B (1110), the amount of skew is much greater when the traces are routed in the warp direction than in the weft direction. Thus, one or more embodiments route the traces in the weft direction while in the fixed region and perform other mechanisms to prevent routing in the warp direction in the flexible region.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of manufacturing a printed circuit board (PCB) comprising:
   determining a weft direction of the PCB;
   defining a routing design of a plurality of differential pairs, the routing design being designed to have a fixed region in the weft direction and a flexible region in a warp direction that is perpendicular to the weft direction, wherein each of the differential pairs in the fixed region are routed according to linear non-angled routing and each of the differential pairs in the flexible region are routed at any angle, and wherein the fixed region and the flexible region are based on spacing between connector pins on the PCB such that the fixed region has closer spacing between the connector pins on the PCB than the flexible region; and
   manufacturing the PCB according to the routing design.

2. The method of claim 1, wherein the routing design is a backplane design.

3. The method of claim 1, further comprising:
   adding a plurality of integrated circuit components to the PCB.

4. The method of claim 1, wherein the routing design is further defined to have at least one differential pair of the plurality of differential pairs routed at a non-zero-degree angle to the warp direction and the weft direction while in the flexible region.

5. The method of claim 1, wherein the routing design is further defined to have at least one differential pair of the plurality of differential pairs routed using offsetting while in the flexible region.

6. The method of claim 1, wherein the routing design is further defined to have at least one differential pair of the plurality of differential pairs routed using arcing while in the flexible region.

7. A printed circuit board (PCB) comprising:
   a spread weave of woven glass fibers having a warp direction and a weft direction;

a plurality of PCB features defining a fixed region of the PCB in the weft direction and a flexible region in the warp direction that is perpendicular to the weft direction; and a plurality of differential pairs of routed traces, the plurality of differential pairs being in the weft direction when in the fixed region, wherein each of the differential pairs in the fixed region are routed according to linear non-angled routing and each of the differential pairs in the flexible region are routed at any angle, and wherein the fixed region and the flexible region are based on spacing between connector pins on the PCB such that the fixed region has closer spacing between the connector pins on the PCB than the flexible region.

8. The PCB of claim 7, wherein the PCB is a backplane.

9. The PCB of claim 7, further comprising:
a plurality of integrated circuit components.

10. The PCB of claim 7, wherein the plurality of differential pairs comprises at least one differential pair routed at a non-zero-degree angle to the warp direction and the weft direction while in the flexible region.

11. The PCB of claim 7, wherein the plurality of differential pairs comprises at least one differential pair routed using offsetting while in the flexible region.

12. The PCB of claim 7, wherein the plurality of differential pairs comprises at least one differential pair routed using arcing while in the flexible region.

13. A method of designing a printed circuit board (PCB) comprising:
determining a weft direction of the PCB;
defining, with a computer processor, a routing design of differential pairs, the routing design being designed to have a fixed region in the weft direction and a flexible region in a warp direction that is perpendicular to the weft direction, wherein each of the differential pairs in the fixed region are routed according to linear non-angled routing and each of the differential pairs in the flexible region are routed at any angle, and wherein the fixed region and the flexible region are based on spacing between connector pins on the PCB such that the fixed region has closer spacing between the connector pins on the PCB than the flexible region; and
transmitting, with the computer processor, the routing design to a manufacturer for manufacture of the PCB according to the routing design.

14. The method of claim 13, wherein the routing design is a backplane design.

* * * * *